US012810937B2

(12) United States Patent
Lien et al.

(10) Patent No.: US 12,810,937 B2
(45) Date of Patent: Nov. 24, 2026

(54) PADDING IN FLASH MEMORY BLOCKS

(71) Applicant: Micron Technology, Inc., Boise, ID (US)

(72) Inventors: Yu-Chung Lien, San Jose, CA (US); Zhenming Zhou, San Jose, CA (US); Murong Lang, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 18/793,392

(22) Filed: Aug. 2, 2024

(65) Prior Publication Data

US 2024/0395329 A1 Nov. 28, 2024

Related U.S. Application Data

(63) Continuation of application No. 17/897,184, filed on Aug. 28, 2022, now Pat. No. 12,057,167.

(51) Int. Cl.

| | |
|---|---|
| ***G11C 16/22*** | (2006.01) |
| ***G11C 16/04*** | (2006.01) |
| ***G11C 16/08*** | (2006.01) |
| ***G11C 16/10*** | (2006.01) |

(52) U.S. Cl.
CPC .......... *G11C 16/08* (2013.01); *G11C 16/0483* (2013.01); *G11C 16/10* (2013.01); *G11C 16/22* (2013.01)

(58) Field of Classification Search
CPC ..................................................... G11C 16/26
See application file for complete search history.

(56) References Cited

U.S. PATENT DOCUMENTS

| | | | | |
|---|---|---|---|---|
| 9,672,149 | B2 | 6/2017 | Park | |
| 10,224,107 | B1 | 3/2019 | Sule | |
| 2004/0083334 | A1 | 4/2004 | Chang et al. | |
| 2012/0260149 | A1 | 10/2012 | Chang et al. | |
| 2021/0391019 | A1 * | 12/2021 | Shin ....................... | G11C 16/22 |

* cited by examiner

*Primary Examiner* — Jason Lappas
(74) *Attorney, Agent, or Firm* — Brooks, Cameron & Huebsch, PLLC

(57) ABSTRACT

A method includes determining a boundary word line in a partial block of a flash memory device, where the partial block includes blank word lines after the boundary word line; determining a single predefined level of pure data to write in at least one of the blank word lines after the boundary word line; and writing the single predefined level of pure data to at least one of the blank word lines after the boundary word line.

20 Claims, 5 Drawing Sheets

PADDING IN FLASH MEMORY BLOCKS

PRIORITY INFORMATION

This Application is a Continuation of U.S. application Ser. No. 17/897,184, filed on Aug. 28, 2022, which issues as U.S. Pat. No. 12,057,167, on Aug. 6, 2024, the contents of which are incorporated herein by reference.

TECHNICAL FIELD

Embodiments of the disclosure relate generally to flash memory blocks, and more specifically, relate to padding in flash memory blocks.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
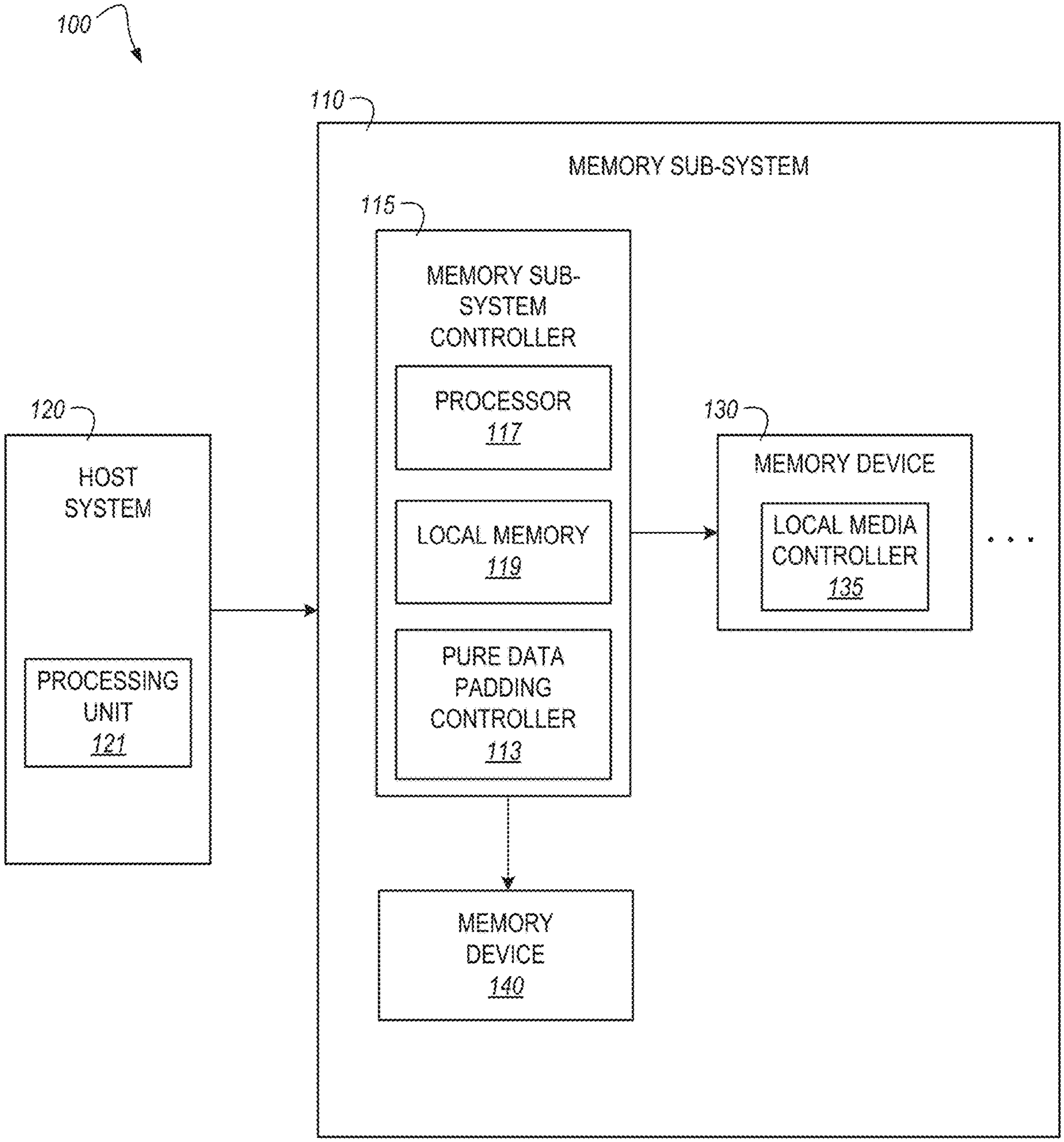
FIG. 1 illustrates an example computing system that includes a memory sub-system in accordance with some embodiments of the present disclosure.

Partial block (PB) is a very common data handling occurrence in NAND flash memory. A PB occurs when data written to the block does not completely fill the block, which results in blank word lines being present in the block. Data in the PB is known to be more prone to error characteristics, such as voltage drifts, due to the presence of the blank word lines.

In contrast to PB, a closed block condition in NAND flash memory is one in which data written to the block completely fills the block. This situation is advantageous as the read level (RL) is optimized under these closed block conditions. Furthermore, a "low state" RL could have slightly higher RL and high state RL could have slightly lower RL if considering the impact such as endurance or data retention. However, RLs are not optimized for PB situations in which a boundary word line (WL) is present. Therefore, read bit error rate (RBER) becomes higher at the boundary WL due to lack of coupling-to-coupling (C2C) from the next WL.

One approach to addressing this situation of PB has been to add "padding" data in the blank word lines. Padding is a method to counter higher RBER while performing read operations on boundary WL of PB. In padding, random data is used to fill the blank WLs above the boundary WL, which pushes the boundary WL voltage towards its target position, thereby helping to reduce RBER. Typically, padding is done using random data above boundary WL.

Despite C2C, which leads to the mismatch of the voltage distance between closed and PB conditions, the openness of the PB also makes a difference. For example, it is possible for a large portion of the block to be empty depending on where the WL occurs (e.g., the voltage distance between WL 180 and 10). Such a large empty space can result in a larger voltage mismatch between closed and PB. Random data used in padding this empty space helps to reduce the voltage differences but does not reduce the amount of random data that needs to be written in these empty spaces. In other words, the more open the block the more WLs need to undergo padding, often requiring most if not all of the blank WLs to be filled in order to be effective in preventing the above noted detrimental voltage shift. This results in more time and resources being used in writing the random data to the open WLs, which is a burden on the system performance. This problem will only become worse as the number of WLs further expands, which will lead to further degradation of system performance. For example, for block by deck (BBD) usage, where there can be around 238 WLs (e.g., one "deck" includes 119 WLs) across different decks, each deck can be viewed as an independent block with a reduced granularity. In such examples, the padding generally cannot be applied across decks or blocks (e.g., the padding can be applied on a deck-by-deck or block-by-block basis).

In contrast to using random data in padding, embodiments of the present disclosure use pure data padding on relatively few WLs for system performance burden mitigation. Pure data padding helps relocate the voltage distribution of the boundary WL under PB usage to be similar as closed block condition, which helps reduce RBER or mitigate the media scan attempt. Pure data does not require lots of WL for padding comparing to random data, which greatly reduces the system performance burden by a significant amount (e.g., up to 97.8%).

Aspects of the present disclosure are directed to pure data padding in memory cell operation, in particular to memory sub-systems that include a pure data padding component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells").

A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory sub-system controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single-level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, a MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

As described above, the memory components can be memory dice or memory packages that form at least a portion of the memory device 130. In some embodiments, the blocks of memory cells can form one or more "superblocks." As used herein, a "superblock" generally refers to a set of data blocks that span multiple memory dice and are written in an interleaved fashion. For instance, in some embodiments each of a number of interleaved NAND blocks can be deployed across multiple memory dice that have multiple planes and/or pages associated therewith. The terms "superblock," "block," "block of memory cells," and/or "interleaved NAND blocks," as well as variants thereof, can, given the context of the disclosure, be used interchangeably.

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140. For instance, in some examples, the memory device 140 can be a DRAM and/or SRAM configured to operate as a cache for the memory device 130. In such instances, the memory device 130 can be a NAND.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device. The memory sub-system 110 can also include additional circuitry or components that are not illustrated.

The memory sub-system 110 can include a pure data padding controller 113. Although not shown in FIG. 1 so as to not obfuscate the drawings, the pure data padding controller 113 can include various circuitry to facilitate aspects related to padding in flash memory blocks, as detailed herein. In some embodiments, the pure data padding controller 113 can include special purpose circuitry in the form of an ASIC, FPGA, state machine, and/or other logic circuitry that can allow the pure data padding controller 113 to orchestrate and/or perform the operations described herein.

In some embodiments, the memory sub-system controller 115 includes at least a portion of the pure data padding controller 113. For example, the memory sub-system controller 115 can include a processor 117 (processing device) configured to execute instructions stored in local memory 119 for performing the operations described herein. In some embodiments, the pure data padding controller 113 is part of the memory sub-system 110, an application, or an operating system.

In a non-limiting example, an apparatus (e.g., the computing system 100) can include a pure data padding controller 113. The pure data padding controller 113 can be resident on the memory sub-system 110. As used herein, the term "resident on" refers to something that is physically located on a particular component. For example, the pure data padding controller 113 being "resident on" the memory sub-system 110 refers to a condition in which the hardware circuitry that comprises the pure data padding controller 113 is physically located on the memory sub-system 110. The term "resident on" can be used interchangeably with other terms such as "deployed on" or "located on," herein.

The pure data padding controller 113 can be configured to determine a boundary word line (WL) in a partial block (PB) of a flash memory device, where the PB includes blank WLs after the boundary WL, determine a single predefined level of pure data to write in at least one of the blank WLs after the boundary WL, and write the single predefined level of pure data to at least one of the blank WLs after the boundary WL. In some embodiments, the pure data padding controller 113 can be configured to use a look-up table to determine the single predefined level of pure data to write to the at least one of the blank WLs after the boundary WL from a word line address of the boundary word line. As discussed herein, the look-up table includes two or more WL groups each associated with an individual range of WL addresses and where each of the two or more WL groups is associated with a different version of the single predefined level of pure data.

Figure 2:
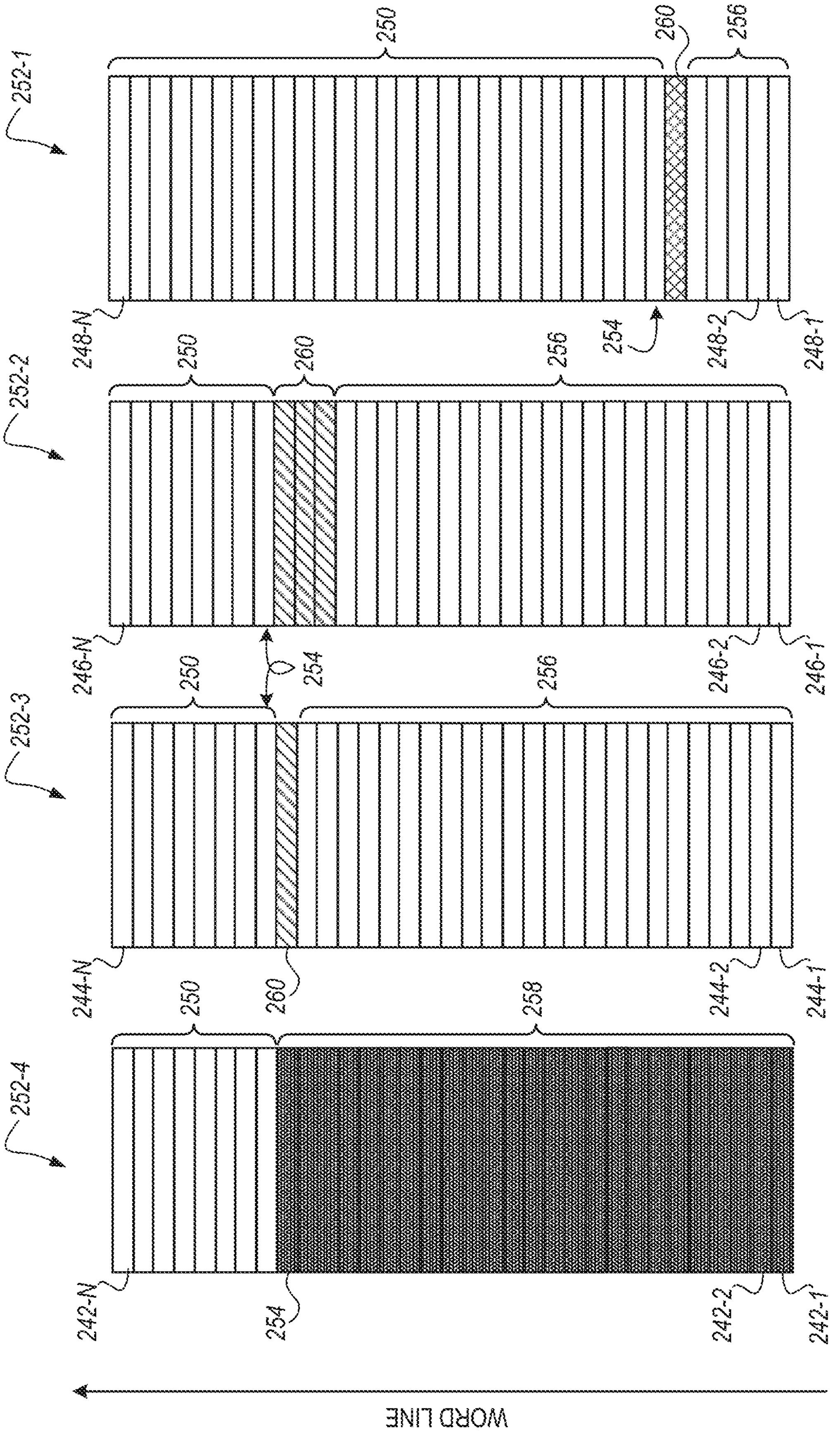
FIG. 2 illustrates an example diagram of a portion of a non-volatile memory device for padding of a partial block of a memory cell in accordance with some embodiments of the present disclosure.

FIG. 2 illustrates an example diagram of a portion of a non-volatile memory device of an apparatus for the padding of the memory blocks operation in accordance with some embodiments of the present disclosure. The diagrams of FIG. 2 illustrate the padding of word lines in memory blocks of the apparatus having blocks of memory cells, such as the memory sub-system 110. As mentioned, the memory sub-system 110 can include media, such as one or more volatile memory devices (e.g., memory device 140). The non-volatile memory device can be coupled to a non-volatile-memory device (e.g., memory device 130). The volatile memory device can be configured to operate as a cache.

The apparatus can include a non-volatile memory having a memory block that included a plurality of word lines (242-1, 242-1, . . . , 242-N; 244-1, 244-1, . . . , 244-N; 246-1, 246-1, . . . , 246-N and 248-1, 248-2, . . . , 248-N), a memory sub-system controller (such as the memory sub-system controller 115 illustrated in FIG. 1) that is configured to write data to the plurality of word lines of the memory block and a pure data padding controller (such as the pure data padding controller 113 illustrated in FIG. 1), as discussed herein. Each of the memory blocks of the non-volatile memory refers to a device having word lines of non-volatile memory cells. The word lines of non-volatile memory cells in the non-volatile memory device can be included as pages in blocks of non-volatile MLCs, TLCs, QLCs, and/or PLCs, among other possibilities.

The word lines in the apparatus can include user data 250 that occupies various numbers of word lines as illustrated in FIG. 2. As shown in FIG. 2, the user data 250 does not completely fill the block, which results in a partial memory block 252-1, 252-2, 252-3 and 252-4 (collectively referred to as 252) of the flash memory device. As illustrated, the partial memory block 252 is at least partially defined by a boundary word line 254, which is the word line at which the user data 250 stops and where blank word lines 256 begin. In the present examples, as the user data 250 does not completely fill the word lines of the block, a partial block (PB) as discussed herein is formed (e.g., when data written to the block does not completely fill the block, which results in blank word lines being present in the block).

As illustrated, the boundary word line 254 in the partial memory block 252 of the flash memory device includes blank word lines 256 adjacent to the boundary word line 254. One traditional approach to padding the blank word lines 256 adjacent to the boundary word line 254 has been to simply use random data to fill the blank word lines above the boundary word line 254, as discussed herein. An example of this is seen with word lines 242-1, 242-2 . . . 242-N, where random data 258 is used to fill what was once blank word lines. However, as discussed herein simply writing random data 258 to fill the blank word lines above the boundary word line 254 results in time and resources being used in in an inefficient manner.

Embodiments of the present disclosure, in contrast, use pure data in padding relatively few word lines for system performance burden mitigation. In this padding operation, a single predefined level of pure data 260 is determined to write in at least one of the blank word lines 256 adjacent to the boundary word line 254. For the various embodiments, pure data can have one of a number of pure data patterns. As used herein, "pure data", "pure data padding" and a "pure data pattern" is where only a single data pattern level (e.g., L3 or L4) is used in writing to at least one of the blank word lines, as discussed herein. For example, in the various embodiments there can be a total of eight of the pure data pattern levels (e.g., L0-L7) that can be used in pure data padding of the present disclosure. When only one of these data patterns is used in writing to at least one of the blank word lines, the data can be referred to as "pure data." In contrast, "random data" is where two or more of the data pattern levels (e.g., L3 and L4) are used in writing to at least one of the blank word lines, as discussed herein. For example, in the various embodiments there can be a total of eight of the pure data pattern level (e.g., L0-L7) that can be used in random data padding of the present disclosure, where two or more of the data patterns is used in writing to at least one of the blank word lines.

For the various embodiments, the location of the boundary word line 254 can help determine which of the pure data pattern levels is used in the pure data padding. For example, according to the present disclosure the word lines of the block (e.g., 244-1, 244-1, . . . , 244-N; 246-1, 246-1, . . . , 246-N; and 248-1, 248-2, . . . , 248-N) can be divided into predetermined ranges that are associated with both an individual range of word line addresses and a pure data pattern to be used in writing in at least one of the blank word lines 256 adjacent to the boundary word line 254. For example, each of eight word line groups (WG0-WG7) can be associated with eight individual range of word line addresses (WL Range) as follows: WG0/WL Range 3-8; WG1/WL Range 9-46; WG2/WL Range 47-84; WG3/WL Range 85-91; WG4/WL Range 94-97; WG5/WL Range 98-137; WG6/WL Range 138-178; WG7/WL Range 179-182. For the various embodiments, a pure data pattern level (e.g., L0-L7) can be assigned to one or more of the word line groups to be written to at least one of the blank word lines adjacent to the boundary word line. As used herein, the assigned pure data pattern level can be referred to as a single predefined level of pure data, where for the various embodiments, the single predefined level of pure data is written to at least one of the blank word lines adjacent to the boundary word line. For the various embodiments, the single predefined level of pure data is a repeating pattern of data.

For the various embodiments, determining the single predefined level of pure data includes determining a word line address of the boundary word line and using the word line address of the boundary word line to determine from a look-up table the single predefined level of pure data to write to the at least one of the blank word lines adjacent to the boundary word line. For the various embodiments, the look-up table can include information corresponding to two or more word line groups each associated with the individual range of word line addresses and where each of the two or more word line groups is associated with a different version of the single predefined level of pure data. For the various embodiments, the single predefined level of pure data does not include random data.

FIG. 2 further provides an embodiment in which two of the word line groups are used to fill the blank word line(s) adjacent to the boundary word line 254. As illustrated, the pure data pattern level (e.g., L0-L7) used in the blank word line(s) adjacent to the boundary word line 254 of the blocks (e.g., 246-1, 246-1, . . . , 246-N and 248-1, 248-2, . . . 248-N) can vary in both number of blank word lines filled and the pure data pattern level used in filling the blank word line(s).

For example, for word lines 246-1, 246-1, . . . , 246-N, the boundary word line 254 falls within WL Range 98-137 (e.g., using the ranges provided above). With the boundary word line 254 falling within WL Range 98-137 the single predefined level of pure data is, for example, L5. In contrast, for word lines 248-1, 248-1, . . . , 248-N, the boundary word line 254 falls within WL Range 9-46 (e.g., using the ranges provided above). With the boundary word line 254 falling within WL Range 9-46 the single predefined level of pure data is, for example, L2.

For the various embodiments, writing the single predefined level of pure data 260 begins in a blank word line immediately adjacent to the boundary word line 254. As illustrated in FIG. 2, writing the single predefined level of pure data 260 fills less than all of the blank word lines 256 after the boundary word line 254. Examples of this are seen in the word lines of the block (e.g., 244-1, 244-1, . . . 244-N; 246-1, 246-1, . . . , 246-N; and 248-1, 248-2, . . . , 248-N). For the various embodiments, writing the single predefined level of pure data 260 can fill one or more of the blank word line immediately adjacent to the boundary word line 254. For example, as illustrated for word lines 244-1, 244-1, . . . , 244-N and 248-1, 248-2, . . . , 248-N, writing the single predefined level of pure data 260 fills only one of the blank word lines after the boundary word line 254. In contrast, as illustrated for word lines 246-1, 246-1, . . . , 246-N, writing the single predefined level of pure data 260 fills two or more of the blank word lines after the boundary word line 254, but less than all of the blank word lines adjacent to the boundary word line 254.

Figure 3:
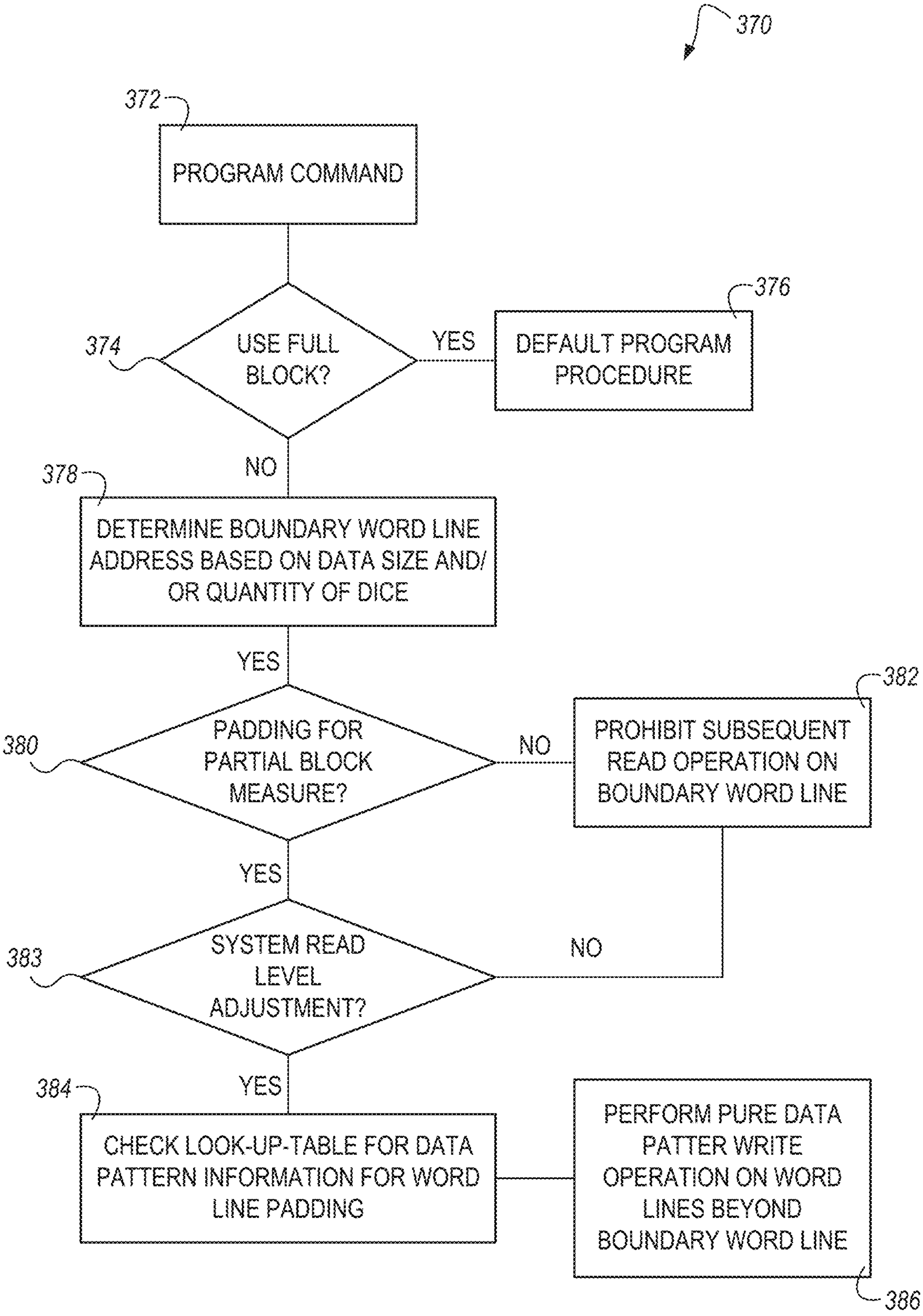
FIG. 3 illustrates a flow diagram for padding of a partial block of a memory cell in accordance with some embodiments of the present disclosure.

FIG. 3 illustrates a flow diagram 370 directed to pure data padding in memory cell operation, in particular to memory sub-systems that include a pure data padding component, according to the present disclosure. The method 370 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 370 is performed by the pure data padding controller 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 372, a memory device (e.g., memory device 130) has user data written to the word lines of the memory blocks therein. For the various embodiments, a memory controller, as discussed herein, can be configured to write data to the plurality of word lines of the memory block, where the plurality of word lines can include a boundary word line at which the data ends leaving blank word lines in the memory block to form a partial block.

At 374, a determination as to whether the word lines of a given memory block are full or not (e.g., are there blank word lines in the memory block to form a partial block) is made. Such a determination can be done with the pure data padding controller (e.g., 113), as described herein. If the pure data padding controller determines that there are no empty word lines in a given memory block, the memory sub-system proceeds with its default program procedure at 376.

If, however, the pure data padding controller determines that there are empty word lines in a given memory block, the boundary word line address, as discussed herein, is determined at 378. From this address, the pure data padding controller is configured to determine the single predefined level of pure data to write in at least one of the blank word lines adjacent to the boundary word line. As discussed herein, this determination is a function of word line range in which the boundary word line address is found (e.g., the size of the data in the partial block and the number of dice in the memory block).

At 380, a determination is made as to whether the padding as a partial block countermeasure according to the present disclosure is warranted. This determination can be made in part based on both the size of the data in the partial block and the number of memory dice in the block along with the address of the boundary word line. For example, where there are only just a few open word lines, it may be the case that implementing the pure data padding of the present disclosure is not warranted and further read operations on the boundary word line are stopped at 382.

At 383, a determination is made as to whether or not the memory sub-system (e.g., memory sub-system 110) includes a read level adjustment or handling for a partial block situation. When the situation does not arise, the read operation for the boundary word line is prevented. For example, there may be some limitation of the controller that may not have enough space for the look-up table (LUT) and/or if the controller is otherwise unable to process data written to the LUT. On the other hand, if LUT is not an issue (e.g., if the controller includes sufficient computing resources for the LUT, etc.), then a read operation involving the boundary word line can still be performed.

If, however, the determination is made that padding the partial block is a warranted countermeasure, at 384 the pure data padding controller determines the single predefined level of pure data to write in at least one of the blank word lines adjacent to the boundary word line. As discussed herein, determining the single predefined level of pure data using the pure data padding controller can include determining the word line address of the boundary word line and using the word line address of the boundary word line to determine from a look-up table the single predefined level of pure data to write to the at least one of the blank word lines adjacent to the boundary word line. As provided herein, the look-up table includes information corresponding to two or more word line groups each associated with the individual range of word line addresses and, as provided herein, each of the two or more word line groups is associated with a different version of the single predefined level of pure data.

At 386, the pure data padding controller writes the single predefined level of pure data to at least one of the blank word lines adjacent to the boundary word line. For the various embodiments, the pure data padding controller can write the single predefined level of pure data at 386 beginning in a blank word line immediately adjacent to the boundary word line.

The pure data padding controller is also configured to write the single predefined level of pure data at 386 in less than all of the blank word lines adjacent to the boundary word line. For example, the pure data padding controller is configured to write the single predefined level of pure data in only one of the blank word lines adjacent to the boundary word line. As discussed herein, the single predefined level of pure data can be a repeating pattern of data. For the various embodiments, the pure data padding controller can also be further configured to write the single predefined level of pure data at 386 as part of an operation to relocate a threshold voltage distribution associated with the boundary word line when the memory block is partially filled.

Figure 4:
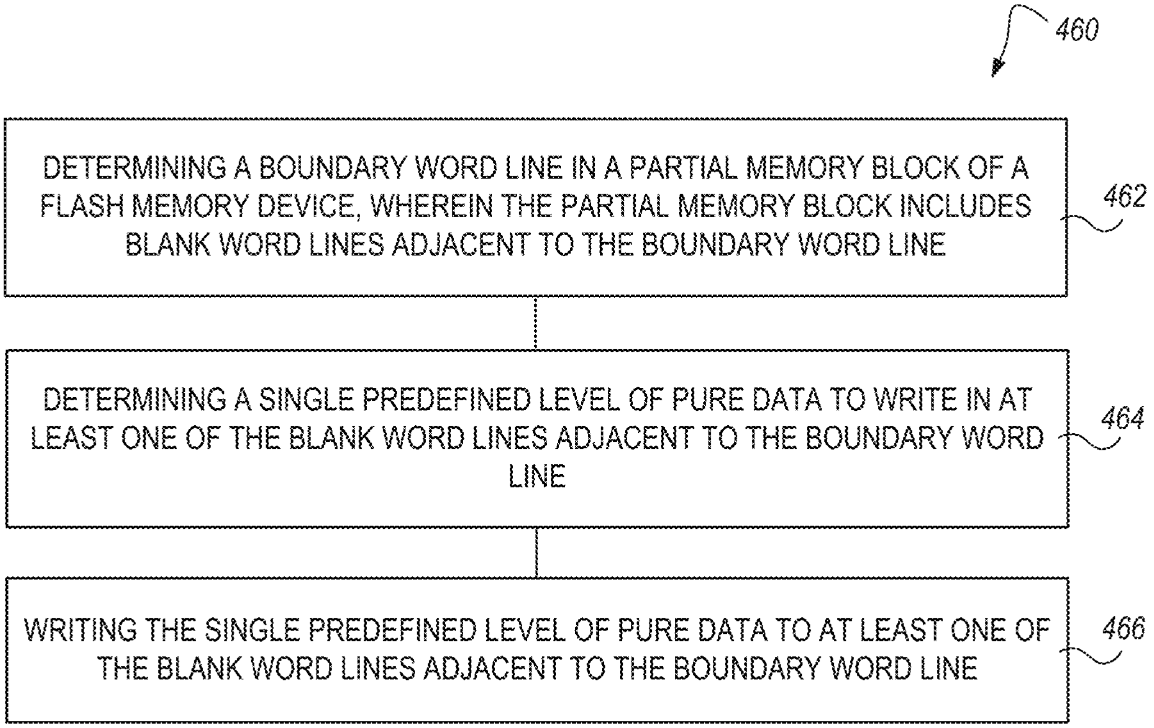
FIG. 4 is a flow diagram corresponding to a method for padding of a partial block of a memory cell in accordance with some embodiments of the present disclosure.

FIG. 4 is a flow diagram corresponding to a method for padding of the memory blocks operation in accordance with some embodiments of the present disclosure. The method 460 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 460 is performed by the pure data padding controller 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 462, the boundary word line in a partial memory block of the flash memory device is determined. As provided herein, the partial memory block is a memory block having a plurality of word lines that include blank word lines adjacent to the boundary word line. As provided herein, a controller (e.g., the memory sub-system controller 115) is configured to write data to the plurality of word lines of the memory block, where the plurality of word lines includes the boundary word line at which the data ends leaving blank word lines in the memory block to form the PB. In some embodiments the partial memory block is at least partially defined by the boundary word line, which is the word line at which the user data stops and where blank word lines begin. As mentioned, as the user data does not completely fill the word lines of the block, this creates the PB as discussed herein (e.g., when data written to the block does not completely fill the block, which results in blank word lines being present in the block).

At operation 464, the single predefined level of pure data to write in at least one of the blank word lines adjacent to the boundary word line. As discussed herein, the pure data padding controller is configured to determine the single predefined level of pure data to write in at least one of the blank word lines after or adjacent to the boundary word line, where the pure data padding controller is further configured to write the single predefined level of pure data to at least one of the blank word lines after or adjacent to the boundary word line. As provided herein, the location of the boundary word line helps to determine which of the pure data pattern levels is used in the pure data padding, as detailed herein. For instance, the pure data padding controller is configured to determine the single predefined level of pure data by determining the word line address of the boundary word line and using the word line address of the boundary word line to determine from a look-up table the single predefined level of pure data to write to the at least one of the blank word lines after or adjacent to the boundary word line.

For the various embodiments, the look-up table can include information corresponding to two or more word line groups each associated with the individual range of word line addresses and where each of the two or more word line groups is associated with a different version of the single predefined level of pure data. If, however, the partial block is more open (e.g., there are fewer word lines being programmed), the pure data for padding will have higher levels (e.g., L6) and if the partial block is mostly filled, the pure data for padding will have lower levels (e.g., L1).

From the address, the pure data padding controller is configured to determine the single predefined level of pure data to write in at least one of the blank word lines adjacent to the boundary word line. As discussed herein, this determination is a function of word line range in which the boundary word line address is found (e.g., the size of the data in the partial block and the number of dice in the memory block). For the various embodiments, the single predefined level of pure data does not include random data. Rather, the single predefined level of pure data can be, for example, a repeating pattern of data.

At operation 466, the single predefined level of pure data is written to at least one of the blank word lines adjacent to the boundary word line. As provided herein, the pure data padding controller can be configured to write the single predefined level of pure data beginning in a blank word line immediately adjacent to the boundary word line. In other words, the single predefined level of pure data written to the at least one of the blank word lines adjacent to the boundary word line can begin in a blank word line immediately adjacent to the boundary word line. The pure data padding controller can also be configured to write the single predefined level of pure data in less than all of the blank word lines adjacent to the boundary word line. For example, writing the single predefined level of pure data can fill only one of the blank word lines after the boundary word line. In contrast, writing the single predefined level of pure data can fill two or more of the blank word lines after the boundary word line, but in less than all of the blank word lines adjacent to the boundary word line. As discussed herein, the pure data padding controller is configured to write the single predefined level of pure data as part of an operation to relocate a threshold voltage distribution associated with the boundary word line when the memory block is partially filled.

Figure 5:
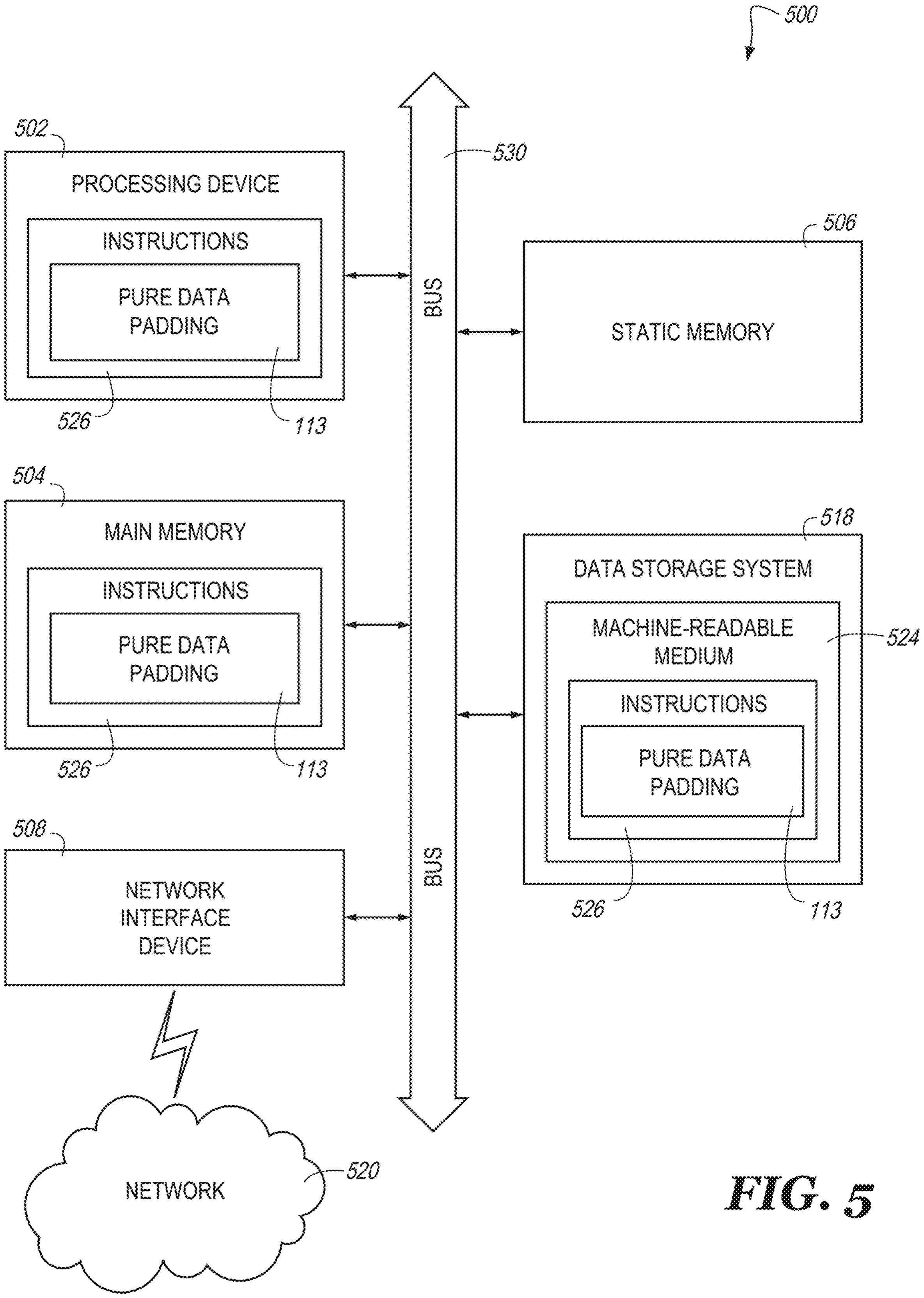
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the pure data padding controller 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a pure data component (e.g., the pure data padding controller 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer).

In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc. In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:

a memory array comprising blocks of memory cells; and a controller coupled to the memory array to:

determine a boundary word line in a partially written block of the memory array, wherein the partially written block includes a number of erased word lines adjacent to the boundary word line;

determine a single data pattern level to write to at least one of the number of erased word lines adjacent to the boundary word line; and write the single data pattern level to the at least one of the number of erased word lines adjacent to the boundary word line.

2. The apparatus of claim 1, wherein the memory array comprises NAND flash memory cells.

3. The apparatus of claim 1, wherein the controller is to determine the single data pattern level from a look-up table.

4. The apparatus of claim 3, wherein the look-up table maps word line addresses to data pattern levels.

5. The apparatus of claim 3, wherein the look-up table maps word line groups to data pattern levels.

6. The apparatus of claim 3, wherein the single data pattern level is one of multiple data pattern levels to which the memory cells are programmable.

7. The apparatus of claim 1, wherein the controller is to write the single data pattern level to the at least one of the number of erased word lines adjacent to the boundary word line starting with an erased word line immediately adjacent to the boundary word line.

8. The apparatus of claim 1, wherein the controller is to write the single data pattern level to only one of the number of erased word lines adjacent to the boundary word line.

9. The apparatus of claim 1, wherein the controller is to write the single data pattern level to fewer than all of the number of erased word lines adjacent to the boundary word line.

10. A method, comprising:

writing data to a plurality of word lines of a block of memory cells, wherein the plurality of word lines includes a boundary word line at which the data ends leaving a number of erased word lines in the memory block to form a partially written block; and determining a single data pattern level to write to at least one of the number of erased word lines adjacent to the boundary word line; and writing the single data pattern level to the at least one of the number of erased word lines adjacent to the boundary word line.

11. The method of claim 10, wherein the method includes accessing a look-up table to determine the single data pattern level to be written to the at least one of the number of word lines adjacent to the boundary word line.

12. The method of claim 10, wherein the method includes determining the single data pattern level based on an address of the boundary word line.

13. The method of claim 10, wherein the method includes writing the single data pattern to only one of the number of word lines adjacent to the boundary word line.

14. The method of claim 10, wherein the method includes writing the single data pattern to the at least one of the number of word lines adjacent to the boundary word line beginning with a word line immediately adjacent to the boundary word line.

15. A system comprising:

a controller;

a flash memory device comprising a number of blocks of memory cells; and a controller coupled to the flash memory device to:

write data to fewer than all of the word lines of a particular block of the number of blocks such that the particular block is a partially written block having a boundary word line at which the data ends leaving one or more erased word lines in the particular block; and write a single data pattern level to at least one of the one or more erased word lines after the boundary word line.

16. The system of claim 15, wherein the memory cells are programmable to one of a plurality of different data pattern levels, and wherein the single data pattern level is a particular one of the plurality of different data pattern levels.

17. The system of claim 16, wherein the plurality of different data pattern levels comprises at least eight different data pattern levels.

18. The system of claim 15, wherein the controller is to access a look-up table to determine the single data pattern level to be written to the at least one of the one or more erased word lines after the boundary word line.

19. The system of claim 18, wherein the look-up table includes two or more word line groups each associated with an individual range of word line addresses and wherein each of the two or more word line groups is associated with a different single data pattern level.

20. The system of claim 15, wherein the system comprises a managed NAND (MNAND) device.

* * * * *